(12) United States Patent
Choi et al.

(10) Patent No.: US 11,721,406 B2
(45) Date of Patent: Aug. 8, 2023

(54) GENERATING TEST DATA FOR A MEMORY SYSTEM DESIGN BASED ON OPERATION OF A TEST SYSTEM, AND RELATED METHODS, DEVICES, AND SYSTEMS

(71) Applicant: Micron Technology, Inc., Boise, ID (US)

(72) Inventors: Won Ho Choi, Santa Clara, CA (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/395,988

(22) Filed: Aug. 6, 2021

(65) Prior Publication Data

US 2023/0037415 A1 Feb. 9, 2023

(51) Int. Cl.
*G11C 29/14* (2006.01)
*G11C 11/406* (2006.01)
*G11C 29/46* (2006.01)
*G11C 29/12* (2006.01)

(52) U.S. Cl.
CPC ........ *G11C 29/14* (2013.01); *G11C 11/40615* (2013.01); *G11C 11/40626* (2013.01); *G11C 29/12005* (2013.01); *G11C 29/46* (2013.01)

(58) Field of Classification Search
CPC ... G11C 29/14; G11C 29/12005; G11C 29/46; G11C 11/40615; G11C 11/40626
See application file for complete search history.

(56) References Cited

U.S. PATENT DOCUMENTS

| 2008/0148076 | A1* | 6/2008 | Gabor | G06F 1/3203 |
| | | | | 713/300 |
| 2009/0237415 | A1* | 9/2009 | Athas | G09G 3/3406 |
| | | | | 345/589 |
| 2014/0195837 | A1* | 7/2014 | Park | G06F 1/3287 |
| | | | | 713/323 |
| 2016/0187949 | A1* | 6/2016 | Sen | H04W 52/0277 |
| | | | | 713/310 |

FOREIGN PATENT DOCUMENTS

WO WO-2020206021 A1 * 10/2020 ........... G01S 13/876

\* cited by examiner

*Primary Examiner* — Sultana Begum
(74) *Attorney, Agent, or Firm* — TraskBritt

(57) ABSTRACT

Methods and systems for testing memory systems are disclosed. A refresh rate for a test system including a number of memory devices may be controlled based on estimated power scenario of a memory system design. In response to performance of a number of refresh operations on the memory devices and based on the refresh rate, one or more conditions of the test system may be monitored to generate estimated performance data for the memory system design.

20 Claims, 9 Drawing Sheets

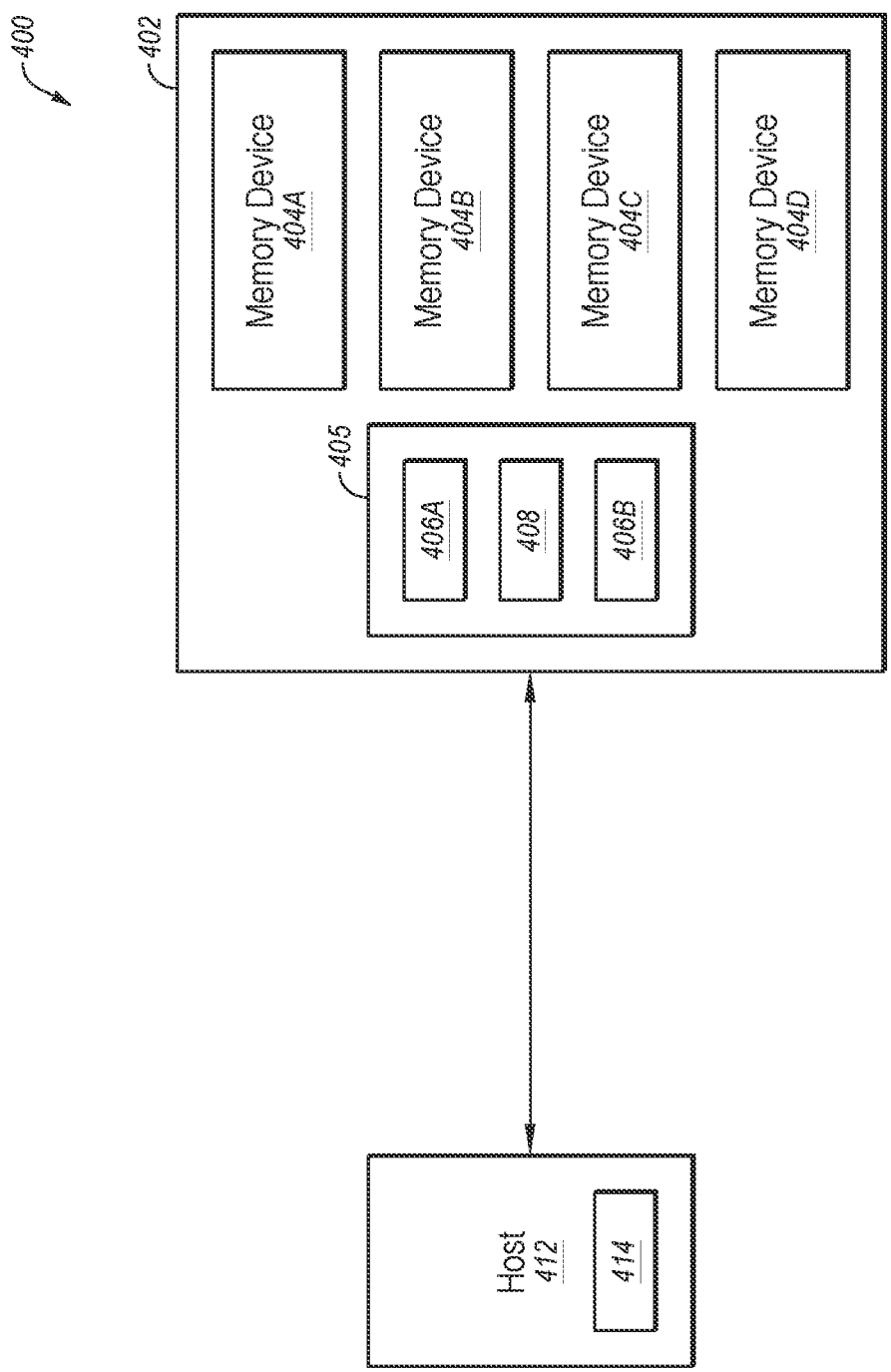

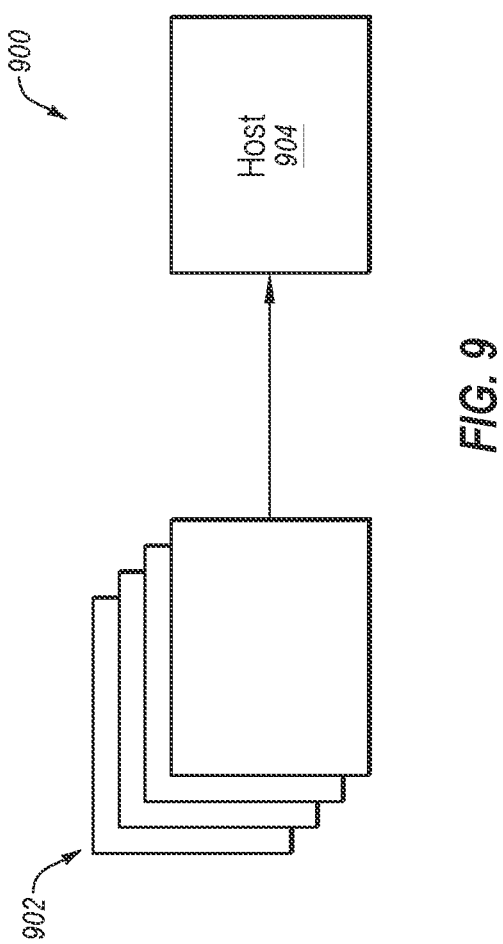

GENERATING TEST DATA FOR A MEMORY SYSTEM DESIGN BASED ON OPERATION OF A TEST SYSTEM, AND RELATED METHODS, DEVICES, AND SYSTEMS

TECHNICAL FIELD

Embodiments of the disclosure relate to memory system testing, and more specifically to generating test data for a memory system design. Yet more specifically, various embodiments relate to generating a thermal profile and/or a power profile for a memory system design, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Semiconductor memory devices typically include many memory cells that are capable of holding a charge that is representative of a bit of data. Typically, these memory cells are arranged in a memory array. Data may be written to or retrieved from a memory cell by selectively activating the memory cell.

BRIEF DESCRIPTION OF THE DRAWINGS

FIG. 4 is a block diagram of an example memory system including a memory module and a host, in accordance with various embodiments of the disclosure.

FIG. 9 is a simplified block diagram of an example system including a number of memory devices and a host, in accordance with various embodiments of the disclosure.

DETAILED DESCRIPTION

Figure 1:
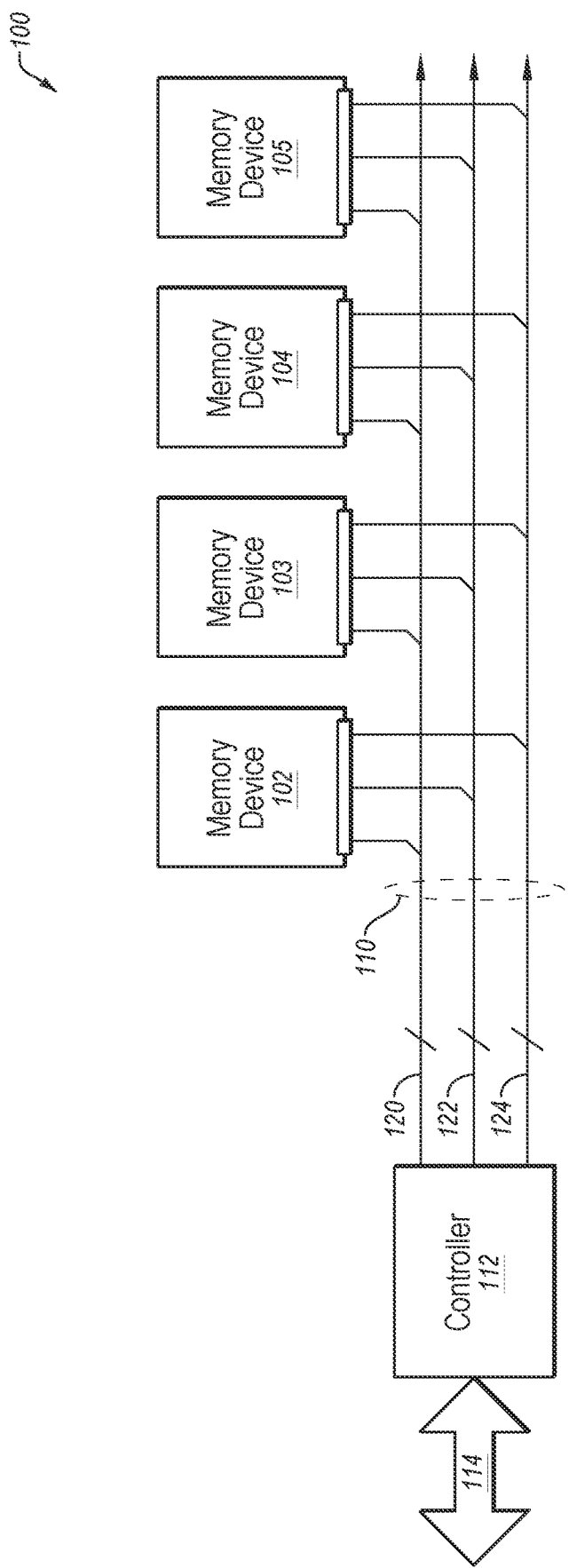
FIG. 1 is a block diagram of an example memory system including a number of memory devices, in accordance with various embodiments of the disclosure.

As will be appreciated by a person having ordinary skill in the art, a memory system (e.g., a memory module including a number of memory devices (e.g., a dual in-line memory module (DIMM))) may include a thermal budget, and various factors of the memory system, such as density, speed, configuration, and/or workload of the memory system, may affect a thermal profile and/or a power profile of the memory system. Further, it may be advantageous (e.g., for memory system customers and/or hyperscalers) to perform thermal testing and/or power analyses of a memory system design to determine power and/or thermal requirements for the memory system design (e.g., prior to an associated memory system being fully operational (e.g., prior to CPU and DIMM availability)) based on various factors (e.g., density, speed, configuration, and/or workload of the memory system design). However, current systems and methods may not allow for a memory system design (e.g., a DIMM design) to be tested to generate a thermal and/or power profile for the memory system design.

As is well-known in the art, memory cells of a memory device (e.g., DRAM memory cells), each of which essentially consists of a capacitor, must be periodically refreshed to retain data stored in the memory device. A refresh operation is typically performed by essentially reading data bits from the memory cells in each row of a memory cell array and then writing those same data bits back to the same cells in the row. A refresh operation is generally performed on a row-by-row basis at a rate needed to keep charge stored in the memory cells from leaking excessively between refreshes. Further, as will be appreciated by a person having ordinary skill in the art, a refresh rate (e.g., 1× or 2× according to conventional DRAM specifications) may be controlled (e.g., increased) to reduce the adverse effects of row hammering. Since a refresh operation essentially involves reading data bits from and writing data bits to a large number of memory cells, a refresh operation tends to be a particularly power-hungry operation.

According to various embodiments, as described more fully below, a test memory system (also referred to herein as a "test system") may be tested based on an estimated power scenario of a memory system design (also referred to herein as a "memory system model," "a target memory system," a "memory system of interest," or some variation thereof) to generate estimated performance data for the memory system design. More specifically, according to various embodiments, power consumption of a test memory system, which includes a number of memory devices, may be controlled (e.g., via an associated host) to emulate various system parameters of a memory system design. More specifically, a refresh rate of a test system may be controlled to control the power consumption of the test system to emulate various power scenarios, which may be estimated based on various parameters of a memory system design, such as density, speed, configuration, and/or workload of the memory system design. State another way, various embodiments of the disclosure relate to controlling a refresh rate of one or more memory devices of a test system to emulate various power scenarios for a memory system design to generate performance data for the memory system design. For example, a refresh rate may include a multiple of one (1) (e.g., 1×, 2×, 3×, 4×, etc.), a multiple of two (2) (e.g., 2×, 4×, 8×, 16×), and/or a non-integer multiple (e.g., 3.5×, 3.75×, 4.3×, 8.8×, etc.) to emulate an estimated power scenario, which may be selected based on various parameters of a memory system design.

According to various embodiments, a power scenario (i.e., an expected amount of power consumption) for a memory system design may be determined (e.g., estimated) based on one or more parameters (e.g., speed, density, configuration, workload, without limitation) of the memory system design. More specifically, according to various embodiments, an expected amount of power consumption for different parameters (e.g., speed (e.g., 4800 MB/s, 6400 MB/s, without limitation), densities (e.g., 64 GB, 128 GB, 256 GB), configurations (e.g., DIMM type, such as 1R×4, 2R×4, 1R×8, 2R×8, without limitation, and/or DIMM allocation type, such as one DIMM per channel, two DIMMS per channel, without limitation), workloads (e.g., bandwidth, command queue, page hit rate, without limitation), etc.) of memory systems may be known and/or determined (e.g., via prior testing, simulation, and/or a memory module power calculator).

Moreover, according to various embodiments, a refresh rate for the test system may be determined and set based on the determined power scenario. More specifically, according to various embodiments, a profile (e.g., power and/or current profile) across refresh rates for memory systems may be determined (e.g., via prior testing, simulation, and/or a memory module power calculator) and the profile may be mapped to refresh rates (e.g., in a look-up table). Further in response to a determining a power scenario (i.e., of a memory system design), a refresh rate for the test system may be determined (e.g., via the look-up table) and set (e.g., via a host and/or other processor or controller).

Further, in response to performance of a number of refresh operations on the test system (i.e., according to the determined refresh rate), data associated with the test system may be sensed and used to generate estimated data from the memory system design (e.g., a thermal profile and/or a power profile). More specifically, according to some embodiments, in response to performance of a number of refresh operations on the test system, temperature data may be read (e.g., via a host) from one or more temperature sensors (e.g., of the test system) and a thermal profile and/or a power profile for the memory system design (e.g., a DIMM design) may be generated based on the temperature data. Further, according to some embodiments, a generated thermal profile and/or power profile may be used to determine a thermal budget for the memory system design (e.g., prior to development of an associated memory system).

According to various embodiments, during testing, a test system (e.g., a test module) including a number of memory devices may consume power and distribute heat in a similar manner to a functional memory system (e.g., a functional DIMM). More specifically, one or more memory devices of the test system may consume power and distribute heat in a similar manner to a fully operational memory system (e.g., a DIMM).

According to various embodiments, a test system may include a Joint Electron Device Engineering Council (JEDEC) compliant DIMM, JEDEC compliant semiconductor die, and/or JEDEC compliant semiconductor package, may be used with a conventional module socket (e.g., a conventional DIMM socket), and/or may include the same form factor as a conventional memory module (e.g., a conventional DIMM, such as a DDR4 DIMM or a DDR5 DIMM). As will be appreciated, various embodiments are not limited to any specific memory system, but rather the embodiments described herein may be applicable to any memory system utilizing a refresh scheme.

Although various embodiments are described herein with reference to memory devices, the disclosure is not so limited, and the embodiments may be generally applicable to microelectronic devices that may or may not include semiconductor devices and/or memory devices. Embodiments of the disclosure will now explained with reference to the accompanying drawings.

FIG. 1 illustrates an example memory system 100, according to various embodiments of the disclosure. Memory system 100 includes a number of memory devices 102, 103, 104 and 105 coupled to a communication bus 110 (e.g., a system bus). Each memory device 102-105 may include one or more memory die, and collectively, memory devices 102-105 may be referred to as a memory module (e.g., a dual in-line memory module (DIMM)).

Memory system 100 further includes a controller (also referred to herein as a "host") 112 coupled to each memory device 102-105 via communication bus 110. Controller 112, which may include a processor or any other suitable type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB). In various embodiments, memory system 100 may include a DIMM and one or more memory devices 102-105 may be a rank (or a number of ranks) of the DIMM.

Figure 2:
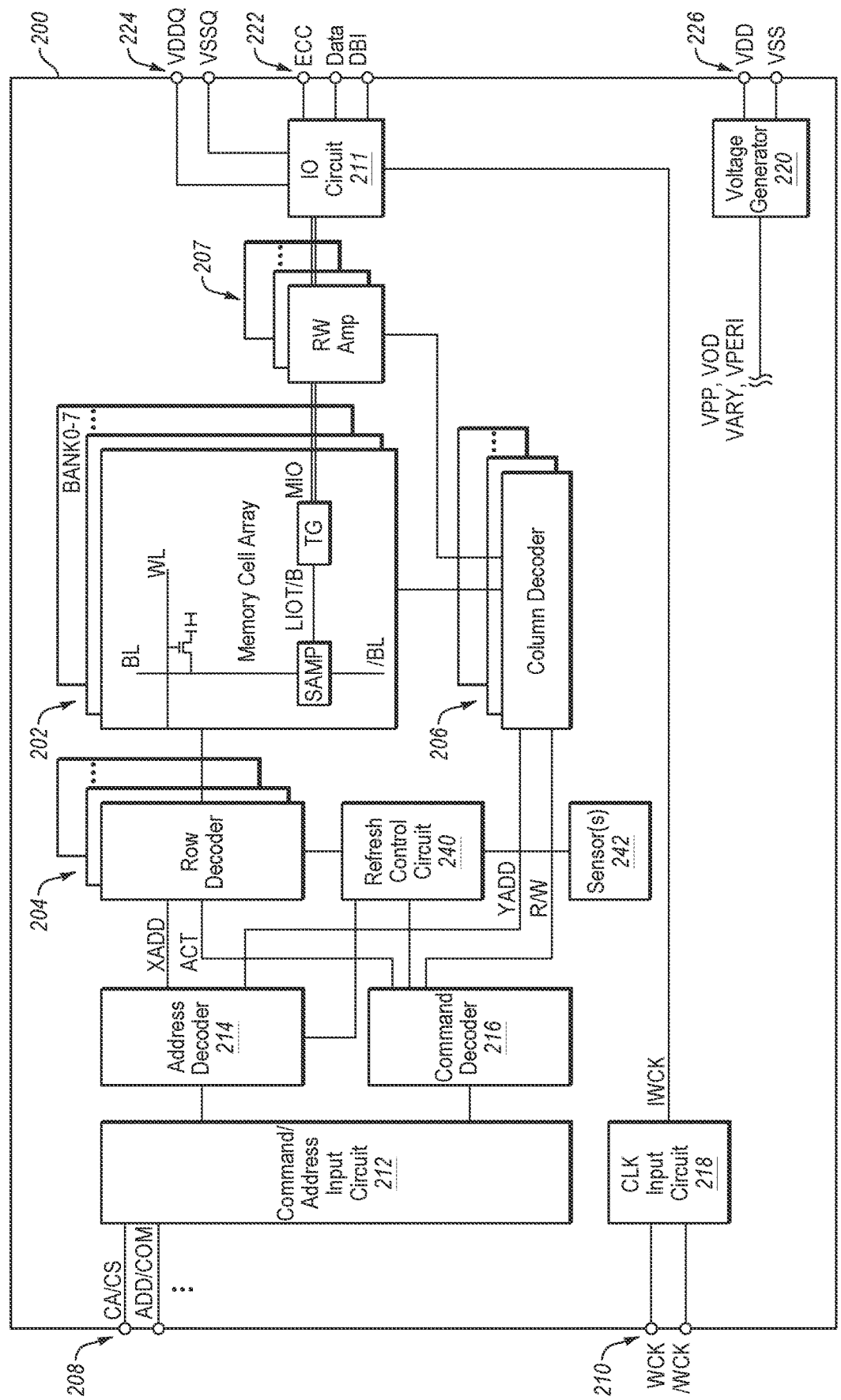
FIG. 2 is a block diagram of an example memory device, according to various embodiments of the disclosure.

FIG. 2 includes a block diagram of an example memory device 200, according to various embodiments of the disclosure. One or more of the memory devices shown in FIG. 1 may include memory device 200. Memory device 200 may include, for example, a DRAM (dynamic random access memory), a SRAM (static random access memory), a SDRAM (synchronous dynamic random access memory), a DDR SDRAM (double data rate DRAM, such as a DDR4, DDR5, SDRAM and the like), or a SGRAM (synchronous graphics random access memory). Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 204 and the selection of the bit lines BL and /BL may be performed by a column decoder 206. In the embodiment of FIG. 2, row decoder 204 may include a respective row decoder for each memory bank BANK0-7, and column decoder 206 may include a respective column decoder for each memory bank BANK0-7.

Bit lines BL and /BL are coupled to a respective sense amplifier SAMP. Read data from bit line BL or /BL may be amplified by sense amplifier SAMP, and transferred over complementary local input/output lines (LIOT/B), a transfer gate TG, and complementary main input/output lines (MIOT/B). Conversely, write data may be transferred to sense amplifier SAMP over complementary main input/output lines MIOT/B, transfer gate TG, and complementary local input/output lines LIOT/B, and written in memory cell MC coupled to bit line BL or /BL.

Memory device 200 may be generally configured to be receive various inputs (e.g., from an external controller and/or another memory device) via various terminals, such as command and address terminals 208, clock terminals 210, and data and data mask terminals 222. Memory device 200 may include additional terminals such as power supply terminal 224 and power supply terminal 226, which may be coupled to a voltage generator 220.

During a contemplated operation, one or more command signals, received via command and address terminals 208, may be conveyed to a command decoder 216 via a command/address input circuit 212. Command decoder 216 may include a circuit configured to generate various internal commands via decoding one or more command signals COM. Examples of the internal commands include an active command ACT and a read/write signal R/W.

One or more address signals ADD, received via command and address terminals 208, may be conveyed to an address decoder 214 via command and address input circuit 212. Address decoder 214 may be configured to supply a row address XADD to row decoder 204 and a column address YADD to column decoder 206.

Active command ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 206 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, transfer gate TG, read/write amplifiers 207, an input/output circuit 211, and data terminal 222. Further, in response to active command ACT, a write signal, a row address XADD, and a column address YADD, write data may be supplied to memory array 202 via data terminal 222, input/output circuit 211, read/write amplifiers 207, transfer gate TG, and sense amplifier SAMP. The write data may be written to memory cell MC specified by row address XADD and column address YADD.

Clock signals CK and /CK may be received via clock terminals 210. A clock input circuit 218 may generate internal clock signals IWCK based on clock signals WCK and /WCK. Internal clock signals IWCK may be conveyed to various components of memory device 200. For example, internal clock signals IWCK may be conveyed to input/output circuit 211 (e.g., for controlling the operation timing of input/output circuit 211).

According to various embodiments of the disclosure, memory device 200 may also include a test module 240 (also referred to herein as a "refresh control circuit," "refresh module," "control circuit," of some variation thereof). For example, test module 240 may be configured to receive a refresh signal (e.g., AREF from command decoder 216), which may include a pulse signal that is activated when a command signal COM includes an auto refresh command (e.g., an external refresh command). Test module 240 may also be configured to receive active signal ACT (e.g., from command decoder 216) and row address XADD (e.g., from address decoder 214). Generally, test module 240 may be configured to receive a number of refresh commands (e.g., based on a refresh rate (e.g., as set by a host (e.g., controller 112 of FIG. 1))) and provide a row address (e.g., to row decoder 204) that specifies a particular word line WL to be refreshed. In some examples, refresh control circuit 240 may provide a row address responsive to sequential refresh commands received from a host (e.g., controller 112 of FIG. 1).

According to various embodiments, command decoder 216 and test module 240 may be configured to support any suitable refresh rate, including but not limited to, refresh rates having a multiple of one (1) (e.g., 1×, 2×, 3×, 4×, 5×, etc.), refresh rates having a multiple of two (2) (e.g., 2×, 4×, 8×, 16×), and/or refresh rates having a non-integer multiple (e.g., 1.8, 3.5×, 3.75×, 4.3×, 6.7, 8.8×, etc.). Moreover, according to some embodiments, a host (e.g., controller 112 of FIG. 1) may be configured to generate a command sequence based on a desired refresh rate. More specifically, for example, the host may include software configured such that the host may generate a command sequence to achieve a desired refresh rate at one or more memory devices of a memory system (e.g., a DIMM) (e.g., to emulate a specific power scenario for a memory system design).

Figures 3A, 3B:
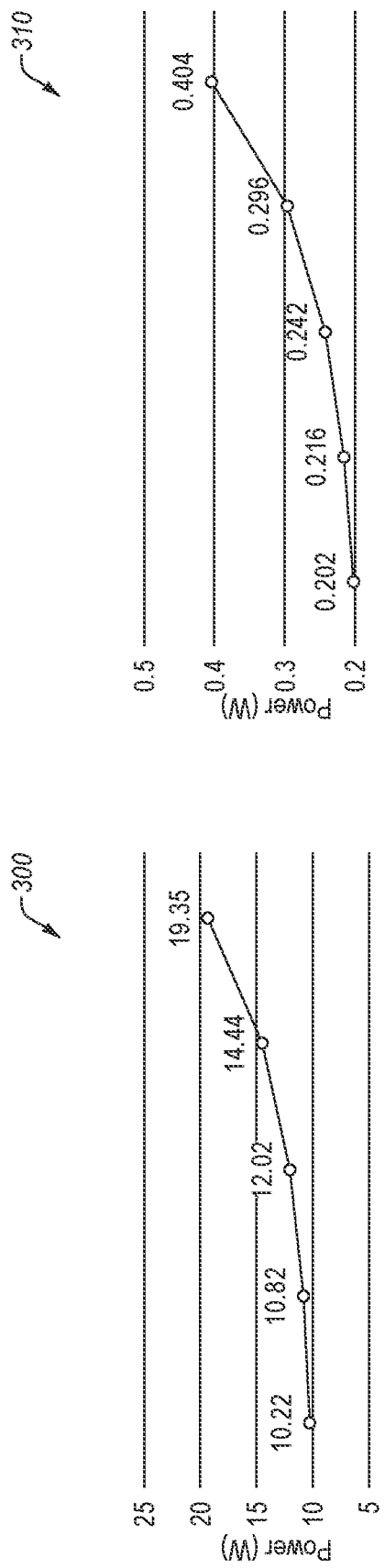
FIGS. 3A and 3B depict plots of power consumption versus refresh rates for a memory system and a memory device, respectively, according to various embodiments of the disclosure.

As will be appreciated, power consumption of a memory system or memory device is dependent on an associated refresh rate (i.e., of a memory system or memory device). FIG. 3A depicts a plot 300 of power consumption (e.g., in Watts (W)) versus a refresh rate for a memory system (e.g., a DIMM including a number of memory devices). Further, FIG. 3B depicts a plot 310 of power consumption (e.g., in Watts (W)) versus refresh rate for a memory device (e.g., a single memory device of a DIMM). As shown in each of plots 300 and 310, as a refresh rate of a memory system (e.g., a DIMM) or a memory device (e.g., DRAM) is increased, the associated power consumption also increases.

As will be further appreciated, in addition to power consumption being dependent on a refresh rate, a temperature of a memory system (or a memory device) is also dependent on a refresh rate. A junction-to-case thermal resistance ($\theta_{JC}$) may be determined via the following equation:

$$\theta_{JC} = (T_J - T_C)/P; \quad (1)$$

wherein $T_J$ is the die junction temperature, $T_C$ is the case temperature (e.g., ambient temperature), and P is the power dissipation from an operating memory device.

Further, junction-to-case thermal resistance $\theta_{JC}$ may be determined via the Joint Electron Device Engineering Council (JEDEC) (e.g., JESD-51 series) standard test conditions and boards, which includes specific dimensions and layer requirements.

Accordingly, based on equation (2) below, as the power dissipation (P) increases with constants $\theta_{JC}$ and $T_C$, the junction temperature may also increase. Thus, as will be appreciated, increasing a refresh rate may increase the power dissipation, which may increase the junction temperature.

$$T_J = \theta_{JC}(\text{constant}) \times P + T_C(\text{constant}). \quad (2)$$

As will be appreciated, the junction temperature may be maintained (e.g., by a host) at or below a thermal budget (requirement). If the junction temperature rises above the thermal budget, one or more thermal management operations may be performed to decrease the junction temperature to or below the thermal budget.

Figure 5:
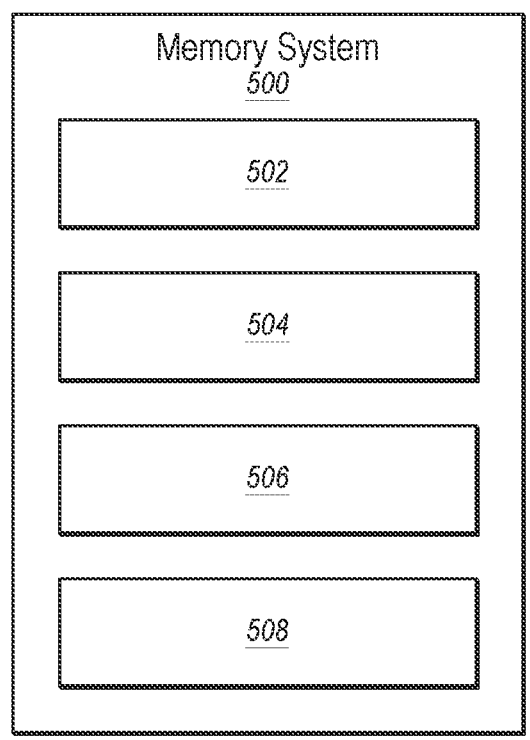
FIG. 5 includes a block diagram of a memory system, according to various embodiments of the disclosure.

FIG. 4 depicts a system 400 including a memory system 402, according to various embodiments of the disclosure. Memory system 402, which may include a DIMM and/or may be referred to herein as a "test system," includes a number of memory devices 404A-404D. For example, system 400 may include memory system 100 of FIG. 1. FIG. 5 includes a block diagram of a memory system 500, according to various embodiments of the disclosure. Memory system 500 of FIG. 5, which may also be referred to herein as a "memory system design," includes a number of defined parameters 502, such as a data rate or speed, a density, a configuration, a workload, without limitation. Further, memory system 500 includes a determined power scenario 504 (i.e., determined based on parameters 502), and estimated performance data 506. Generally, according to various embodiments, as described more fully below, memory system 402 may be tested based on power scenario 504 of memory system 500 to generate estimated performance data 506 of memory system 500. Moreover, as described more fully, below, one or more profiles (e.g., a thermal profile and/or a power profile) of memory system 500 may be generated based on estimated performance data 506.

With reference to FIG. 4, memory system 402 includes a control unit 405 and a number of sensors 406A and 406B, which may include temperature sensors. Control unit 405 may also include a control 408. Memory system 402 may be coupled to a host 412, which may include a controller (e.g., controller 112 of FIG. 1).

Host 412 may be configured to generate (e.g., via BIOS code) a command sequence (e.g., of refresh commands), which may be received by control unit 405 and/or memory devices 404 such that one or more of memory devices 404 may perform refresh operations according to a desired refresh rate. Control 408 (also referred to herein as a "refresh control circuit" or a "control circuit") may be configured to receive a signal from host 412, and in response thereto, control a refresh rate of at least one memory device 404 of memory system 402. In some embodiments, control 408 may not be necessary, and circuitry (e.g., refresh control circuit 240 of FIG. 2) of each memory device 404 may be configured to receive a signal from host 412, and in response thereto, control a refresh rate thereof. Additionally or alternatively, in at least some embodiments, one or more of memory devices 404 may include temperature sensors (e.g., sensors 242 of FIG. 2), and thus, in some embodiments, temperature sensors 406A and/or 406B, which are external to a memory device 404, may not be necessary.

Host 412 may include data storage 414, which may include stored data related to power scenarios (e.g., expected power consumptions) for one or more memory system conditions (e.g., density, speed, configuration, and/or workload of a memory system) and/or refresh rates for power scenarios. For example, data storage 414 may include one or more look-up tables for determining power scenarios (e.g., power scenario 504 of FIG. 5) based on one or more memory system parameters (e.g., parameters 502 of FIG. 5) and/or determining refresh rates based on power scenarios. As disclosed herein, data in data storage 414 may be generated via prior testing, simulation, and/or a power calculator, as will be appreciated by a person having ordinary skill in the art.

According to some embodiments, an expected amount of power consumption for different parameters (e.g., data rates or speeds, densities, configurations, workloads, etc.) of a memory system design may be known and/or determined (e.g., via prior testing, simulation, and/or a power calculator). Stated another way, via prior testing, simulation, and/or use of power calculator, as will be appreciated by a person having ordinary skill, an expected amount of power consumption for a memory system design, configured according to one or more parameters (e.g., speed, density, configuration, and/or workload), may be estimated and/or predicted. Further, according to various embodiments, a profile (e.g., power and/or current profile) across refresh rates for the memory system may be determined (e.g., via prior testing, simulation, and/or a power calculator) and the profile may be mapped to refresh rates (e.g., in a look-up table).

With reference to FIGS. 4 and 5, a contemplated testing operation performed on memory system 402 to generate estimated performance data 506 for memory system 500 will now be described. For example, based on parameters 502 of memory system 500, power scenario 504 may be determined (by host 412 or another processor or controller). As noted above, power scenarios for specific combinations of parameters (e.g., a density, a speed, a configuration, and a workload) may be determined via prior testing and/or via a power calculator. For example, data storage 414 may include data associating a specific combination of parameters with an estimated power scenario. Further, a refresh rate may be determined based on the estimated power scenario. More specifically, for example, host 412 or another processor or controller may identify a refresh rate for an estimated power scenario via a look-up table (e.g., stored in data storage 414 or elsewhere). Moreover, the determined refresh rate may be set, and host 412 may generate a command sequence that may be received by control unit 405 and/or memory devices 404 such that one or more of memory devices 404 may perform refresh operations according to the refresh rate.

In response to performance of a number of refresh commands performed at one or more of memory devices 404, at least one operating condition of memory system 402 may be monitored (e.g., over time). More specifically, for example, in response to performance of a number of refresh commands, one or more temperatures of memory system 402, and more specifically, a temperature of one or more of memory devices 404, may be sensed (e.g., over time) (e.g., via temperature sensors 406A and 404B and/or temperature sensors of one or more of memory devices 404), and temperature data may be conveyed to host 412. In response to received temperature data, a thermal profile may be generated and/or monitored (e.g., via host 412 or another processor or controller) (e.g., over time). Further, according to some embodiments, based on the sensed temperature, an amount of power dissipation from memory system 402 may be determined and/or monitored (e.g., via equation (2) above) (e.g., via host 412 or another processor or controller) (e.g., over time), and a power profile for memory system 500 may be generated. Moreover, during and/or in response to performance of a number of refresh commands, a status of mode register 4 (MR4) may be monitored to evaluate the functionality of refresh rate control of memory system 402. Furthermore, during and/or in response to performance of a number of refresh commands, a number of write and read commands may be conveyed to memory system 402 and write data may be compared to read data to evaluate and/or monitor data retention/integrity performance of memory system 402 (e.g., via host 412). Further, the functionality of refresh rate control of memory system 402 and/or data integrity performance data of memory system 402 may be used to estimate functional and/or performance (e.g., data retention/integrity) for memory system 500.

Accordingly, as will be appreciated, test data for a memory system design may be generated based on power estimates of for the memory system. As one non-limiting example, various embodiments may be configured to generate test data (e.g., thermal and/or power characteristics) for memory system designs (e.g., a DIMM) including 6400 MB/s CPU and/or a 128 GB/256 GB density, even though such memory systems are not yet developed.

Figure 6:
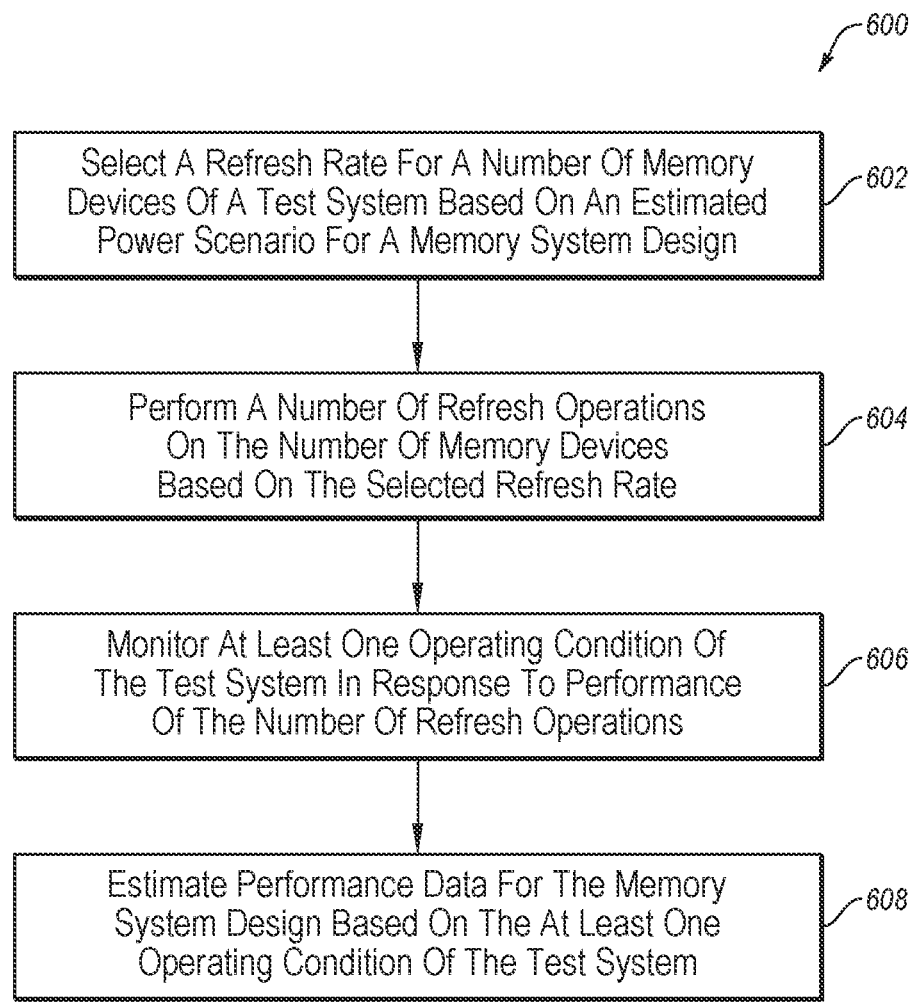
FIG. 6 is a flowchart of an example method of testing a memory system, in accordance with various embodiments of the disclosure.

FIG. 6 is a flowchart of an example method 600 of testing a memory system, in accordance with various embodiments of the disclosure. Method 600 may be arranged in accordance with at least one embodiment described in the disclosure. Method 600 may be performed, in some embodiments, by a device or system, such as memory system 100 of FIG. 1, memory device 200 of FIG. 2, system 400 of FIG. 4, and/or system 900 of FIG. 9, or another device or system. Although illustrated as discrete blocks, various blocks may be divided into additional blocks, combined into fewer blocks, or eliminated, depending on the desired implementation.

Method 600 may begin at block 602, wherein a refresh rate for a number of memory devices of a test system (e.g., memory system 402 of FIG. 4) is selected based on an estimated power scenario for a memory system design (e.g., system 500 of FIG. 5), and method 600 may proceed to block 604. For example, the refresh rate may be selected to have an integer multiple (e.g., multiple of one (1) or two (2), such as 1×, 2×, 3×, 4×, 8×, 16×, without limitation) or a non-integer multiple (e.g., 3.5×, 3.75×, 4.3×, 8.8×, without limitation). Further, for example, the estimated power scenario may be based on one or more of a density of the memory system design, a data rate of the memory system design, a configuration of the memory system design, and/or a workload of the memory system design. Moreover, for example, a host (e.g., host 412 of FIG. 4) may select and/or set the refresh rate for the test system.

At block 604, a number of refresh operations may be performed on the number of memory devices based on the selected refresh rate, and method 600 may proceed to block 606. For example, one or more memory devices of the test system may perform the number of refresh operations with or without a control circuit (e.g., control unit 405 of FIG. 4) of the test system.

At block 606, at least one operating condition of the test system may be monitored in response to performance of the number of refresh operations, and method may proceed to block 608. For example, a temperature of the test system may be monitored via one or more temperature sensors of the test system (e.g., sensor 406A and/or sensor 406B of FIG. 4, and/or sensors of a memory device (e.g., sensors 242 of FIG. 2)). Further, as another example, power dissipation of the test system may be monitored (e.g., based on sensed temperature data). Further, as yet another example, data integrity of the test system may be monitored (e.g., via performing read, write, and compare test operations). For example, a host (e.g., host 412 of FIG. 4) may monitor at least one operating condition of the test system.

At block 608, performance data for the memory system design may be estimated based on the at least one operating condition of the test system. For example, a thermal profile and/or a power profile for the memory system design may be generated. As another example, data retention information for the memory system design may be generated (e.g., in response to read, write, and compare test operations of the test system).

Modifications, additions, or omissions may be made to method 600 without departing from the scope of the disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the desired power scenario may be determined based on one or more memory system parameters (e.g., a density of the memory system design, a data rate of the memory system design, a configuration of the memory system design, and/or a workload of the memory system design). As another example, a method may include one or more acts wherein a thermal response for the memory system design and/or an amount of power dissipated by the memory system design may be estimated based on the estimated performance data.

Figure 7:
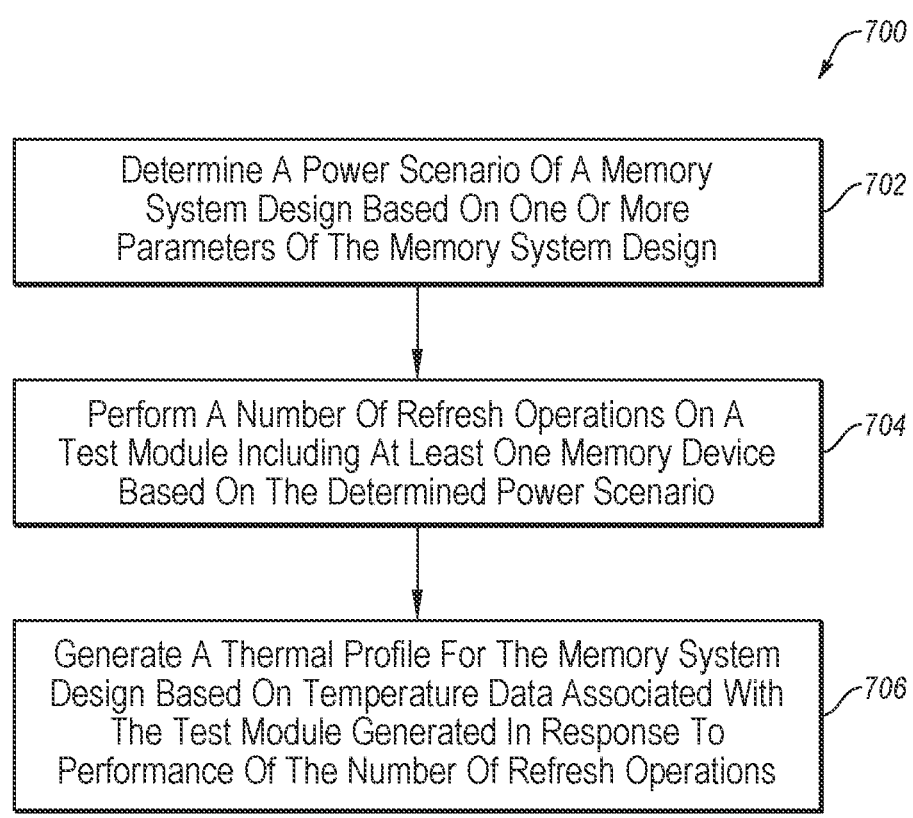
FIG. 7 is a flowchart of another example method of testing a memory system, in accordance with various embodiments of the disclosure.

FIG. 7 is a flowchart of another example method 700 of testing a memory system, in accordance with various embodiments of the disclosure. Method 700 may be arranged in accordance with at least one embodiment described in the disclosure. Method 700 may be performed, in some embodiments, by a device or system, such as memory system 100 of FIG. 1, memory device 200 of FIG. 2, system 400 of FIG. 4, and/or system 900 of FIG. 9, or another device or system. Although illustrated as discrete blocks, various blocks may be divided into additional blocks, combined into fewer blocks, or eliminated, depending on the desired implementation.

Method 700 may begin at block 702, wherein a power scenario of a memory system design may be determined based on one or more parameters of the memory system design, and method 700 may proceed to block 704. For example, the power scenario may be determined based on one or more of a density of the memory system design, a data rate of the memory system design, a configuration of the memory system design, and/or a workload of the memory system design. For example, the power scenario may be determined via a power calculator and/or via one or more testing operations.

At block 704, a number of refresh operations may be performed on a test module including at least one memory device based on the determined power scenario, and method 700 may proceed to block 706. For example, the number of refresh operation may be based on a refresh rate, which may be based on the determined power scenario. For example, the refresh rate may be determined via a look-up table (e.g., including a mapping of refresh rates to power scenarios). For example, the test module may include a DIMM.

At block 706, a thermal profile for the memory system design may be generated based on temperature data generated in response to performance of the number of refresh operations. For example, the thermal profile may be generated via a host (e.g., host 412 of FIG. 4) or another processor or controller.

Modifications, additions, or omissions may be made to method 700 without departing from the scope of the disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the refresh rate for the number of refresh operations is determined. As another example, a method may include one or more acts wherein a power profile for the memory system design may be generated.

Figure 8:
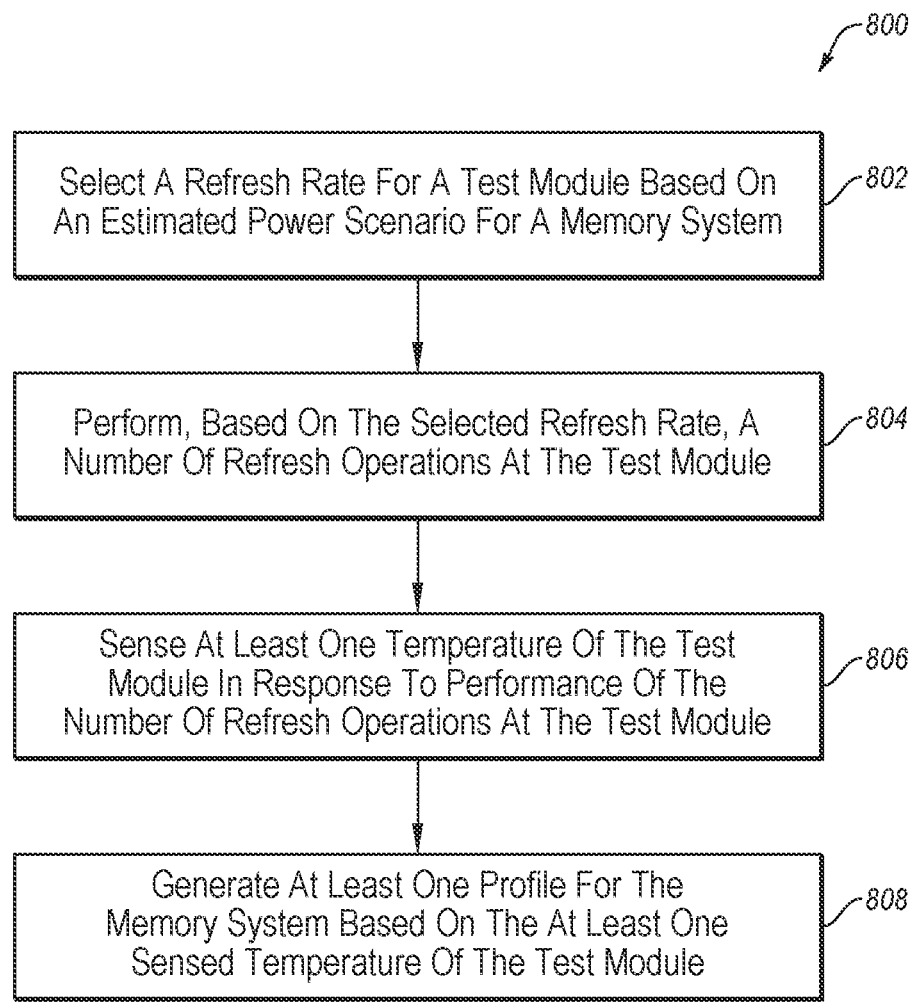
FIG. 8 is a flowchart of yet another example method of testing a memory system, in accordance with various embodiments of the disclosure.

FIG. 8 is a flowchart of yet another example method 800 of testing a memory system, in accordance with various embodiments of the disclosure. Method 800 may be arranged in accordance with at least one embodiment described in the disclosure. Method 800 may be performed, in some embodiments, by a device or system, such as memory system 100 of FIG. 1, memory device 200 of FIG. 2, system 400 of FIG. 4, and/or system 900 of FIG. 9, or another device or system. Although illustrated as discrete blocks, various blocks may be divided into additional blocks, combined into fewer blocks, or eliminated, depending on the desired implementation.

Method 800 may begin at block 802, wherein a refresh rate for a test module may be selected based on an estimated power scenario for a memory system, and method 800 may proceed to block 804. For example, the power scenario may be estimated based on one or more of a density of the memory system, a data rate of the memory system, a configuration of the memory system, and a workload of the memory system. For example, the refresh rate may be selected to have a integer multiple (e.g., a multiple of one or two) or a non-integer multiple.

At block 804, a number of refresh operations may be performed at the test module based on the selected refresh rate, and method 800 may proceed to block 806. For example, the number of refresh operations may be performed on at least one memory device 404 of memory system 402 of FIG. 4.

At block 806, at least one temperature of the test module may be sensed in response to performance of the number of refresh operations at the test module, and method 800 may proceed to block 808. For example, one or more temperature sensors (e.g., sensor 406A and/or sensor 406B of FIG. 4, and/or sensors of a memory device (e.g., sensors 242 of FIG. 2)) on the test module (e.g., memory system 402 of FIG. 4) may sense one or more temperatures of the test module.

At block 808, at least one profile for the memory system may be generated based on the at least one sensed temperature of the test module. For example, a thermal profile (or thermal model) and/or a power profile (or power model) for the memory system may be generated (e.g., via a host (e.g., host 412 of FIG. 4) or another processor or controller) (e.g., in response to temperature data from the test module).

Modifications, additions, or omissions may be made to method 800 without departing from the scope of the disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the power scenario may be estimated. As another example, a method may include one or more acts wherein power dissipation for the test module may be determined based on the at least one sensed temperature of the test module.

As will be appreciated, various embodiments disclosed herein may allow for estimation of power consumption and/or heat distribution of a memory system design, which may allow for generation of a thermal and/or profile of the memory system on interest.

FIG. 9 is a simplified block diagram of a memory system 900 implemented according to one or more embodiments described herein. Memory system 900 may include a number of memory devices 902 and a host 904. Each memory device 902 may include a number of memory banks, wherein each memory bank may include a number of memory cells. Host 904 may be operatively coupled with memory device so as to read, write, or refresh any or all memory cells within memory device. Further, host 904 may be configured to control a refresh rate of one or more of memory devices 902. For example, memory system 900, which may include a DIMM (e.g., including memory devices 902), may be configured to carry out various embodiments disclosed herein.

Various embodiments of the disclosure may include a method. The method may include selecting a refresh rate for a number of memory devices of a test system based on an estimated power scenario for a memory system design. The method may further include performing a number of refresh operations on the number of memory devices based on the selected refresh rate. Moreover, the method may include monitoring at least one operating condition of the test system in response to performance of the number of refresh operations. Also, the method may include estimating performance data for the memory system design based on the at least one operating condition of the test system.

According to at least one other embodiment, a method may include determining a power scenario of a memory system design based on one or more parameters of the memory system design. The method may further include performing a number of refresh operations on a test module including at least one memory device based on the determined power scenario. Moreover, the method may include generating a thermal profile for the memory system design based on temperature data associated with the test module generated in response to performance of the number of refresh operations.

In accordance with one or more other embodiments, a method may include selecting a refresh rate for a test module based on an estimated power scenario for a memory system. The method may also include performing, based on the selected refresh rate, a number of refresh operations at the test module. Moreover, the method may include sensing at least one temperature of the test module in response to performance of the number of refresh operations at the test module. Further, the method may include generating at least one profile for the memory system based on the at least one sensed temperature of the test module.

Various other embodiments include a system. The system may include a test system including a number of memory devices and a host coupled to test system. The host may be configured to convey, to the test system, a number commands based on a refresh rate selected for an estimated power scenario for a memory system design. The host may also be configured to receive a temperature data associated with at least one memory device of the number of memory devices. The system may further include at least one circuit configured to control a refresh rate of at least one memory device of the number of memory device in response to receipt of the number of commands. The at least one memory device may be configured to perform a number of refresh operations responsive to receipt of the number of refresh commands.

In other embodiments, a system may include a first memory system including a number of memory devices and a host coupled to first memory system. The host may be configured to select a refresh rate for the first memory system based on a determined power scenario for a second memory system. The host may also be configured to generate, based on the selected refresh rate, a number of refresh commands to be received by the first memory system. Moreover, the host may be configured to sense at least one operating condition of the first memory system in response to performance of a number of refresh operations at the first memory system. Moreover, the host may be configured to generate estimated performance data for the second memory system based on the at least one operating condition of the first memory system.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method, comprising:
    selecting a refresh rate for a number of memory devices of a test system based on an estimated power scenario for a memory system design;
    performing a number of refresh operations on the number of memory devices based on the selected refresh rate; and
    monitoring at least one operating condition of the test system in response to performance of the number of refresh operations.

2. The method of claim 1, further comprising estimating the power scenario based on one or more parameters of the memory system design.

3. The method of claim 2, wherein estimating the power scenario comprises estimating an estimated amount of power to be consumed by the memory system design based on the one or more parameters of the memory system design.

4. The method of claim 2, wherein estimating the power scenario based on the one or more parameters of the memory system design comprises estimating the power scenario based on a density of the memory system design, a data rate of the memory system design, a configuration of the memory system design, a workload of the memory system design, or any combination thereof.

5. The method of claim 1, wherein selecting the refresh rate comprises selecting the refresh rate including a non-integer multiple.

6. The method of claim 1, wherein monitoring the at least one operating condition comprises at least one of:
    monitoring a thermal response of the test system;
    monitoring power consumption of the test system; and
    monitoring data integrity of the test system.

7. The method of claim 1, further comprising estimating performance data for the memory system design based on the at least one operating condition of the test system, wherein estimating performance data for the memory system design comprises estimating a thermal response for the memory system design, estimating power dissipation for the memory system design, or both.

8. A system, comprising:
    a test system including a number of memory devices and a host, the test system configured to:
    select a refresh rate for the number of memory devices based on an estimated power scenario for a memory system design;
    perform a number of refresh operations on the number of memory devices based on the selected refresh rate; and
    monitor at least one operating condition of the test system in response to performance of the number of refresh operations.

9. The system of claim 8, wherein the host is configured to adjustably select the refresh rate to include an integer multiple or a non-integer multiple based on the estimated power scenario.

10. The system of claim 8, wherein the test system further includes a dual in-line memory module (DIMM) including the number of memory devices.

11. The system of claim 10, wherein the DIMM includes a number of temperature sensors for sensing a temperature of the DIMM.

12. The system of claim 11, wherein the host is configured to receive temperature data from one or more of the number of temperature sensors.

13. The system of claim 8, wherein the host is configured to generate a power profile for the memory system design based on temperature data of the test system, a thermal profile for the memory system design based on the temperature data of the test system, or both.

14. The system of claim 8, wherein the host is configured to:
estimate the power scenario for the memory system design based on a density of the memory system design, a data rate of the memory system design, a configuration of the memory system design, a workload of the memory system design, or any combination thereof; and
determine, via test data, the refresh rate for the estimated power scenario.

15. A test system, comprising:
a memory device configured to perform a number of refresh operations thereon based on a selected refresh rate; and
a host coupled to the memory device and configured to:
select the refresh rate for the memory device based on an estimated power scenario for a memory system design; and
monitor at least one operating condition of the test system in response to performance of the number of refresh operations.

16. The test system of claim 15, the host further configured to estimate performance data for the memory system design based on the at least one operation condition of the test system.

17. The test system of claim 16, the host further configured to generate one or more profiles for the memory system design based on the estimated performance data for the memory system design.

18. The test system of claim 15, wherein the at least one operating condition comprises at least one temperature of the test system.

19. The test system of claim 15, wherein the estimated power scenario is based on a density of the memory system design, a speed of the memory system design, a configuration of the memory system design, a workload of the memory system design, or any combination thereof.

20. The test system of claim 15, further comprising a Joint Electron Device Engineering Council (JEDEC) compliant dual in-line memory module (DIMM).

\* \* \* \* \*